(12) United States Patent
Gross et al.

(10) Patent No.: US 11,746,045 B2
(45) Date of Patent: Sep. 5, 2023

(54) ION-EXCHANGEABLE GLASS WITH HIGH SURFACE COMPRESSIVE STRESS

(71) Applicant: CORNING INCORPORATED, Corning, NY (US)

(72) Inventors: Timothy Michael Gross, Corning, NY (US); John Christopher Mauro, Boalsburg, PA (US)

(73) Assignee: Corning Incorporated, Corning, NY (US)

( * ) Notice: Subject to any disclaimer, the term of this patent is extended or adjusted under 35 U.S.C. 154(b) by 1012 days.

(21) Appl. No.: 16/080,797

(22) PCT Filed: Mar. 1, 2017

(86) PCT No.: PCT/US2017/020204
§ 371 (c)(1),
(2) Date: Aug. 29, 2018

(87) PCT Pub. No.: WO2017/151771
PCT Pub. Date: Sep. 8, 2017

(65) Prior Publication Data
US 2019/0062203 A1    Feb. 28, 2019

Related U.S. Application Data

(60) Provisional application No. 62/303,671, filed on Mar. 4, 2016.

(51) Int. Cl.
*C03C 21/00* (2006.01)
*C03C 3/085* (2006.01)
(Continued)

(52) U.S. Cl.
CPC .......... *C03C 21/002* (2013.01); *C03C 3/085* (2013.01); *G06F 1/1637* (2013.01); *H05K 5/03* (2013.01)

(58) Field of Classification Search
None
See application file for complete search history.

(56) References Cited

U.S. PATENT DOCUMENTS 8,349,454 B2   1/2013   Murata et al.
9,069,521 B2   6/2015   Lee et al.
(Continued)

FOREIGN PATENT DOCUMENTS

CN    102811963 A    12/2012
CN    104703937 A     6/2015
(Continued)

OTHER PUBLICATIONS

Japanese Patent Application No. 2018-545852, Office Action dated Feb. 1, 2021, 10 pages (5 pages of English Translation and 5 pages of Original Document); Japanese Patent Office.
(Continued)

*Primary Examiner* — David Sample
(74) *Attorney, Agent, or Firm* — Jeffrey A. Schmidt (57) ABSTRACT

A glass article comprising an alkali aluminosilicate glass that is formable by down-draw processes for example slot- and fusion-draw to thicknesses of 125 μm or less and is capable of being chemically strengthened by ion-exchange to achieve a compressive stress at its surface of at least 950 MPa, in some embodiments at least about 1000 MPa, and in other embodiments at least about 1100 MPa. The high surface compressive stress allows the glass to retain net compression and thus contain surface flaws when the glass is subjected to bending around a tight radius. The glass may be used in foldable display applications.

25 Claims, 4 Drawing Sheets (51) Int. Cl.
   *G06F 1/16* (2006.01)
   *H05K 5/03* (2006.01)

(56) References Cited

U.S. PATENT DOCUMENTS

| | | |
|---|---|---|
| 2003/0054805 A1 | 3/2003 | Fujisawa et al. |
| 2010/0035745 A1* | 2/2010 | Murata ................ C03C 21/002 501/66 |
| 2011/0014475 A1* | 1/2011 | Murata ................ C03C 3/083 428/410 |
| 2011/0232945 A1 | 9/2011 | Whitcomb et al. |
| 2013/0004758 A1 | 1/2013 | Dejneka et al. |
| 2013/0009909 A1 | 1/2013 | Yamazaki et al. |
| 2014/0023865 A1 | 1/2014 | Comte et al. |
| 2014/0050911 A1 | 2/2014 | Mauro et al. |
| 2014/0139380 A1 | 5/2014 | Ouyang et al. |
| 2016/0376186 A1 | 12/2016 | Gross |
| 2017/0274627 A1 | 9/2017 | Chang et al. |
| 2017/0338182 A1 | 11/2017 | Gross et al. |

FOREIGN PATENT DOCUMENTS

| | | |
|---|---|---|
| CN | 104781201 A | 7/2015 |
| JP | 64-042025 A | 2/1989 |
| JP | 2000-516903 A | 12/2000 |
| JP | 2002-288068 A | 10/2002 |
| JP | 2006-290704 A | 10/2006 |
| JP | 2013-502370 A | 1/2013 |
| JP | 2013-037678 A | 2/2013 |
| JP | 2013-521615 A | 6/2013 |
| JP | 2015-527970 A | 9/2015 |
| JP | 2015-529182 | 10/2015 |
| JP | 3200838 U | 11/2015 |
| KR | 10-2015-0038177 A | 4/2015 |
| TW | 201408618 A | 3/2014 |
| TW | 201412676 A | 4/2014 |
| WO | 2012126394 A1 | 9/2012 |
| WO | 2013063002 A2 | 5/2013 |
| WO | 2013130665 A2 | 9/2013 |
| WO | WO-2014025068 A2 * | 2/2014 ............ C03C 3/085 |
| WO | 2015/057552 A2 | 4/2015 |
| WO | 2015130516 A1 | 9/2015 |

OTHER PUBLICATIONS

International Search Report and Written Opinion of the International Searching Authority; PCT/US2017/020204; dated May 30, 2017; 22 Pages; European Patent Office.

Chinese Patent Application No. 201780014947.X; Office Action dated Dec. 2, 2020; 20 Pages; Chinese Patent Office.

Taiwanese Patent Application No. 106106927, Summary of Official Action dated Dec. 11, 2020, 8 Pages (English Translation Only); Taiwanese Patent Office.

Korean Patent Application No. 10-2018-7028293, Notice of Allowance dated Nov. 20, 2020, 3 pages (1 page of English Translation and 2 pages of Original Document); Korean Patent Office.

Japanese Patent Application No. 2021-162733, Office Action, dated Nov. 30, 2022, 4 pages (2 pages of English Translation and 2 pages of Original Copy); Japanese Patent Office.

\* cited by examiner

ION-EXCHANGEABLE GLASS WITH HIGH SURFACE COMPRESSIVE STRESS

CROSS-REFERENCE TO RELATED APPLICATIONS

This application claims the benefit of priority under 35 U.S.C. § 371 of International Patent Application Serial No. PCT/US2017/020204, filed on Mar. 1, 2017, which in turn, claims the benefit of priority of U.S. Provisional Patent Application Ser. No. 62/303,671 filed on March 4, 2016, the contents of each of which are relied upon and incorporated herein by reference in their entireties.

BACKGROUND

The disclosure relates to an ion-exchangeable glass. More particularly, the disclosure relates to an ion-exchangeable alkali aluminosilicate glass capable of achieving high surface compressive stress.

Glasses used for displays in electronic devices are typically chemically or thermally tempered to produce a surface compressive layer. This compressive layer serves to arrest flaws that can cause failure of the glass. Foldable displays for electronic applications may benefit from thin, bendable glass. When subjected to bending, however, the beneficial flaw-arresting effect of the surface compressive layer is reduced to the extent that surface flaws are deeper than the compressive layer, thus causing the glass to fail when bent.

SUMMARY

The present disclosure provides a glass article that comprises an alkali aluminosilicate glass that is formable by down-draw processes, for example, slot- and fusion-draw to thicknesses of about 125 µm or less and is capable of being chemically strengthened by ion-exchange to achieve a compressive stress at its surface of at least about 950 MPa, in some embodiments at least about 1000 MPa, and in other embodiments at least about 1100 MPa. The high surface compressive stress allows the glass to retain net compression and thus contain surface flaws when the glass is subjected to bending around a tight radius. The glass may be used in foldable display applications.

Accordingly, one aspect of the disclosure is to provide a glass article comprising an alkali aluminosilicate glass. The alkali aluminosilicate glass comprises: $Li_2O$, $Na_2O$, MgO, and ZnO, wherein $Li_2O(mol\ \%)/R_2O(mol\ \%) \geq 0.2$, where $R_2O=Li_2O+Na_2O+K_2O+Rb_2O+Cs_2O$. The alkali aluminosilicate glass is free of $P_2O_5$ and is ion-exchangeable.

A second aspect of the disclosure is to provide an ion-exchanged glass. The ion-exchanged glass has a thickness of up to about 1 mm and is an alkali aluminosilicate glass comprising $Li_2O$, $Na_2O$, MgO, and ZnO, wherein $Li_2O(mol\ \%)/R_2O(mol\ \%) \geq 0.2$, where $R_2O=Li_2O+Na_2O+K_2O+Rb_2O+Cs_2O$, and wherein the alkali aluminosilicate glass is free of $P_2O_5$. The ion-exchanged glass has a compressive layer extending from a surface of the glass to a depth of layer of up to about 30 µm within the glass. The compressive layer has a maximum compressive stress at the surface of at least about 950 MPa, in some embodiments at least about 1000 MPa, and in other embodiments at least about 1100 MPa.

A third aspect of the disclosure is to provide an alkali aluminosilicate glass comprising: from about 60 mol % to about 70 mol % $SiO_2$; from about 10 mol % to about 16 mol % $Al_2O_3$; from about 2 mol % to about 10 mol % $Li_2O$; from about 8 mol % to about 13 mol % $Na_2O$; from greater than 0 mol % to about 6 mol % MgO; and from about 2 mol % to about 6 mol % ZnO, wherein $Li_2O(mol\ \%)/R_2O(mol\ \%) \geq 0.2$, where $R_2O=Li_2O+Na_2O+K_2O+Rb_2O+Cs_2O$, wherein the alkali aluminosilicate glass is free of $P_2O_5$. The alkali aluminosilicate glass has a thickness t of about 125 µm or less and is ion-exchangeable to achieve a compressive stress at a surface of the alkali aluminosilicate glass of at least about 950 MPa, in some embodiments at least about 1000 MPa, and in other embodiments at least about 1100 MPa, and a compressive layer extending from the surface of the glass to a depth of layer within the glass of about 0.25 t or less.

These and other aspects, advantages, and salient features will become apparent from the following detailed description, the accompanying drawings, and the appended claims.

DETAILED DESCRIPTION

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the terms "glass article" and "glass articles" are used in their broadest sense to include any object made wholly or partly of glass. Unless otherwise specified, all compositions are expressed in terms of mole percent (mol %). Coefficients of thermal expansion (CTE) are expressed in terms of $10^{-7}/°$ C. and represent a value measured over a temperature range from about 20° C. to about 300° C., unless otherwise specified.

Unless otherwise specified, all temperatures are expressed in degrees Celsius (° C.). As used herein, the term "softening point" refers to the temperature at which the viscosity of a glass is approximately $10^{7.6}$ poise (P); the term "anneal point" refers to the temperature at which the viscosity of a glass is approximately $10^{13.2}$ poise; the term "35 kP temperature ($T^{35\ kP}$)" refers to the temperature at which the viscosity of a glass is approximately 35 kilopoise (kP); and the term "fictive temperature" refers to the temperature at which the viscosity of a glass is approximately $10^{11}$ Poise.

As used herein, the term "zircon breakdown temperature" or "$T^{breakdown}$" refers to the temperature at which zircon—which is commonly used as a refractory material in glass processing and manufacture—breaks down to form zirconia and silica, and the term "zircon breakdown viscosity" refers to the viscosity of the glass at $T^{breakdown}$. The term "liquidus viscosity" refers to the viscosity of a molten glass at the liquidus temperature, wherein the liquidus temperature refers to the temperature at which crystals first appear as a molten glass cools down from the melting temperature, or the temperature at which the very last crystals melt away as temperature is increased from room temperature.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, a glass that is "free of" or "substantially free of $B_2O_3$," for example, is one in which $B_2O_3$ is not actively added or batched into the glass, but may be present in very small amounts (e.g., <0.001 mol %) as a contaminant. Similar to $B_2O_3$, other components may be characterized as "free of" or "substantially free of" in the same manner.

As used herein, "maximum compressive stress" refers to the highest compressive stress value measured within the compressive layer. Compressive stress and depth of layer are measured using those means known in the art. Such means include, but are not limited to, measurement of surface stress (FSM) using commercially available instruments, for example, the FSM-6000, manufactured by Luceo Co., Ltd. (Tokyo, Japan) or the like, and methods of measuring compressive stress and depth of layer are described in ASTM 1422C-99, entitled "Standard Specification for Chemically Strengthened Flat Glass," and ASTM 1279.19779 "Standard Test Method for Non-Destructive Photoelastic Measurement of Edge and Surface Stresses in Annealed, Heat-Strengthened, and Fully-Tempered Flat Glass," the contents of which are incorporated herein by reference in their entirety. Surface stress measurements rely upon the accurate measurement of the stress optical coefficient (SOC), which is related to the birefringence of the glass. SOC in turn is measured by those methods that are known in the art, for example, fiber and four point bend methods, both of which are described in ASTM standard C770-98 (2008), entitled "Standard Test Method for Measurement of Glass Stress-Optical Coefficient," the contents of which are incorporated herein by reference in their entirety, and a bulk cylinder method.

Figure 1:
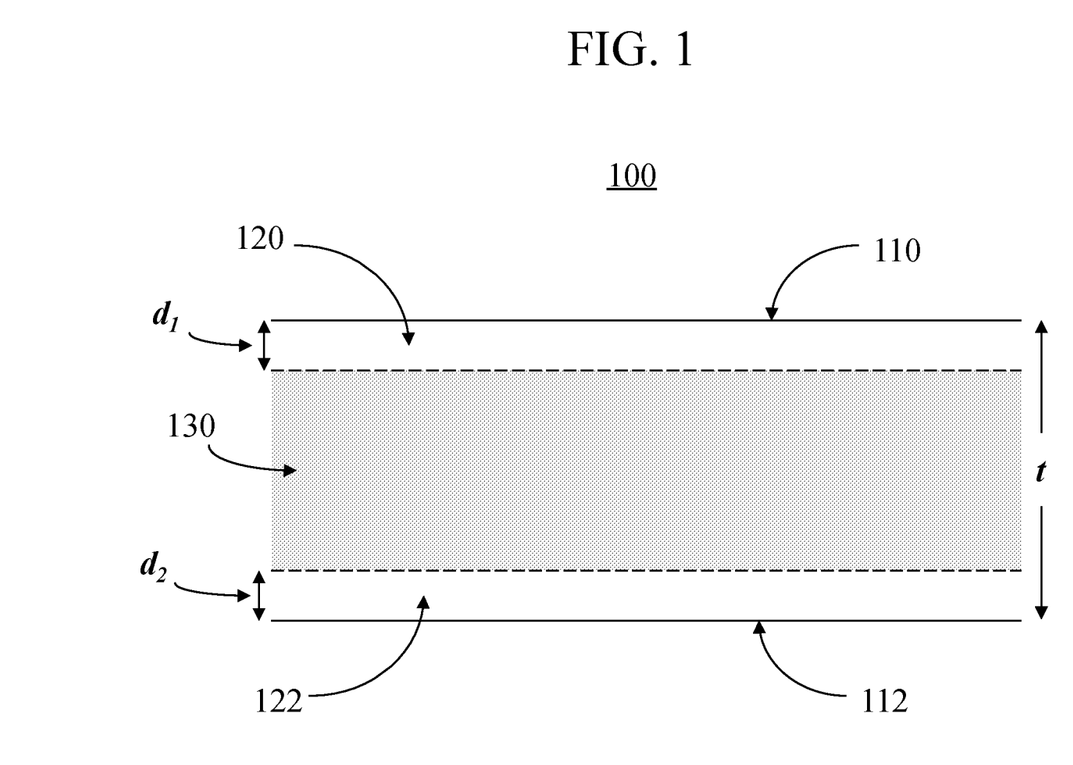
FIG. 1 is a cross-sectional schematic view of an ion-exchanged glass article.

Referring to the drawings in general and to FIG. 1 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

In bendable thin glass (i.e., 0.150 mm (150 µm) or less), a high level of surface compressive stress is desirable, as it allows net compression to be retained on all surfaces as bend radius decreases. Near-surface flaws cannot extend to failure if they are contained under this net compression or within the effective surface compressive layer.

Glass articles that comprise fusion-formable alkali aluminosilicate glasses that are capable of being chemically strengthened by ion-exchange to achieve high surface compressive stress are provided. The high surface compressive stress serves to allow smaller bend radii while retaining a net compression on all surfaces of the glass, thus improving bend performance of the glass in those applications in which thin glass (0.1 mm or less) is used. In some embodiments, these glasses have liquidus viscosities of about 500 kP or more and zircon breakdown viscosities and temperatures that are less than their 35 kP temperatures ($T^{35\ kP}$).

In some embodiments, the glasses described herein have a thickness t in a range from about 0.010 mm (10 µm) to about 0.150 mm (150 µm) or, in some embodiments, in a range from about 0.010 mm (10 µm) to about 0.125 mm (125 µm) or, in still other embodiments, in a range from about 0.010 mm (10 µm) to about 0.100 mm (100 µm).

The alkali aluminosilicate glasses (also referred to herein as the "glasses" or "glass") described herein are free of $P_2O_5$ and comprise $SiO_2$, $Al_2O_3$, $Li_2O$, $Na_2O$, MgO, and ZnO, wherein $Li_2O$(mol %)/$R_2O$(mol %)≥0.2, where $R_2O=Li_2O+Na_2O+K_2O+Rb_2O+Cs_2O$. In some embodiments, $Li_2O$(mol %)/$R_2O$(mol %)≤0.95, in other embodiments $Li_2O$(mol %)/$R_2O$(mol %)≤0.90, and, in still other embodiments, $Li_2O$(mol %)/$R_2O$(mol %)≤0.50. The alkali oxides $K_2O$, $Rb_2O$, and $Cs_2O$ may not necessarily be included in the glass; the addition of these oxides is thus optional.

In some embodiments, the alkali aluminosilicate glasses described herein comprise or consist essentially of: from about 60 mol % to about 70 mol % $SiO_2$ (60 mol %≤$SiO_2$≤70 mol %); from about 10 mol % to about 16 mol % $Al_2O_3$ (12 mol %≤$Al_2O_3$≤14 mol %); from about 2 mol % to about 10 mol % $Li_2O$ (2 mol %≤$Li_2O$≤10 mol %); from about 8 mol % to about 13 mol % $Na_2O$ (8 mol %≤$Na_2O$≤13 mol %); from greater than 0 mol % to about 6 mol % MgO (0 mol %<MgO≤6 mol %); and from about 2 mol % to about 6 mol % ZnO (2 mol %≤ZnO≤6 mol %).

In some embodiments, the alkali aluminosilicate glasses described herein comprise or consist essentially of: from about 62 mol % to about 68 mol % $SiO_2$ (62 mol %≤$SiO_2$≤68 mol %); from about 12 mol % to about 14 mol % $Al_2O_3$ (12 mol %≤$Al_2O_3$≤14 mol %); from about 2 mol % to about 6 mol % $Li_2O$ (2 mol %≤$Li_2O$≤6 mol %); from about 8 mol % to about 13 mol % $Na_2O$ (8 mol %≤$Na_2O$≤13 mol %); from greater than 0 mol % to about 3 mol % MgO (0 mol %<MgO≤3 mol %); and from about 2 mol % to about 5 mol % ZnO (2 mol %≤ZnO≤5 mol %).

In some embodiments, the glass may further include less than about 1 mol % $SnO_2$ (0 mol %≤$SnO_2$<1 mol %) and, in other embodiments, up to about 0.5 mol % $SnO_2$ (0 mol %≤$SnO_2$≤0.5 mol %), as a fining agent. In some embodiments, these glasses are free of at least one of $B_2O_3$, $K_2O$, CaO, and BaO.

Table 1 lists non-limiting, exemplary compositions of the alkali aluminosilicate glasses described herein. Table 2 lists selected physical properties determined for the examples listed in Table 1. The physical properties listed in Table 2 include: density; low temperature CTE; strain, anneal and softening points; fictive ($10^{11}$ Poise) temperature; zircon breakdown and liquidus viscosities; Poisson's ratio; Young's modulus; shear modulus; refractive index, and stress optical coefficient.

TABLE 1

Examples of the alkali aluminosilicate glass compositions described herein.

| Composition (mol %) | A | B | C | D | E | F | G |
|---|---|---|---|---|---|---|---|
| $SiO_2$ | 67.64 | 67.48 | 67.62 | 67.55 | 67.54 | 67.49 | 67.47 |
| $Al_2O_3$ | 12.57 | 12.43 | 12.55 | 12.54 | 12.55 | 12.53 | 13.97 |
| $Li_2O$ | 12.59 | 12.55 | 12.07 | 11.82 | 11.52 | 11.37 | 10.20 |
| $Na_2O$ | 1.65 | 1.82 | 1.93 | 2.08 | 2.23 | 2.33 | 0.14 |
| MgO | 0.05 | 0.05 | 0.05 | 0.05 | 0.05 | 0.05 | 0.00 |
| ZnO | 2.78 | 2.97 | 3.07 | 3.24 | 3.39 | 3.50 | 2.78 |
| $SnO_2$ | 0.20 | 0.20 | 0.21 | 0.21 | 0.22 | 0.22 | 0.49 |
| $Li_2O/Na_2O$ | 0.20 | 0.20 | 0.21 | 0.21 | 0.22 | 0.22 | 0.49 |

| Composition (mol %) | H | I | J | K | L | M | O |
|---|---|---|---|---|---|---|---|
| $SiO_2$ | 67.45 | 67.44 | 67.47 | 67.26 | 67.25 | 62.98 | 67.56 |
| $Al_2O_3$ | 13.98 | 14.00 | 13.98 | 13.98 | 13.99 | 13.69 | 13.30 |
| $Li_2O$ | 4.97 | 4.99 | 5.01 | 5.05 | 4.99 | 2.51 | 3.69 |
| $Na_2O$ | 9.96 | 9.67 | 9.48 | 9.26 | 8.97 | 12.60 | 11.00 |
| MgO | 0.28 | 0.41 | 0.53 | 0.67 | 0.81 | 3.52 | 1.16 |
| ZnO | 2.86 | 2.98 | 3.00 | 3.23 | 3.43 | 4.45 | 2.91 |
| $SnO_2$ | 0.00 | 0.00 | 0.00 | 0.00 | 0.00 | 0.05 | 0.05 |
| $Li_2O/Na_2O$ | 0.50 | 0.52 | 0.53 | 0.55 | 0.56 | 0.20 | 0.34 |

| Composition (mol %) | P | Q | R |
|---|---|---|---|
| $SiO_2$ | 67.51 | 67.46 | 67.50 |
| $Al_2O_3$ | 13.26 | 13.27 | 13.28 |
| $Li_2O$ | 3.75 | 3.75 | 3.73 |
| $Na_2O$ | 10.76 | 10.52 | 10.30 |
| MgO | 1.28 | 1.42 | 1.54 |
| ZnO | 3.03 | 3.18 | 3.23 |
| $SnO_2$ | 0.05 | 0.05 | 0.05 |
| $Li_2O/Na_2O$ | 0.35 | 0.36 | 0.36 |

TABLE 2

Selected physical properties of the glasses listed in Table 1.

| | A | B | C | D | E | F | G |
|---|---|---|---|---|---|---|---|
| Density (g/cm³) | 2.475 | 2.477 | 2.478 | 2.481 | 2.483 | 2.483 | 2.464 |
| CTE ($\times 10^{-7}$/° C.) | 76.9 | 77.2 | 75.3 | 74.2 | 72.3 | 71.9 | 73.2 |
| Strain Pt. (° C.) | 569 | 569 | 576 | 578 | 582 | 583 | 574 |
| Anneal Pt. (° C.) | 622 | 621 | 628 | 630 | 634 | 634 | 626 |
| Softening Pt. (° C.) | 885.1 | 878.7 | 888.5 | 893.1 | 897.6 | 895.3 | 887.8 |
| $10^{11}$ Poise Temperature | 711 | 709 | 716 | 718 | 722 | 721 | 714 |
| Liquidus Viscosity (Poise) | | | 1168136 | | 1276847 | 794369 | 38290 |
| Zircon Breakdown Viscosity (Poise) | | | 33753 | | 23398 | 26309 | |
| Poissons ratio | | | 0.208 | | 0.208 | 0.207 | 0.209 |
| Young's Modulus (GPa) | | | 76.9 | | 77.4 | 77.4 | 78.7 |
| Shear Modulus (GPa) | | | 31.8 | | 32.1 | 32.1 | 32.5 |
| Stress Optical Coefficient (nm/mm/MPa) | 3.084 | 3.102 | 3.076 | 3.085 | 3.082 | 3.111 | 3.087 |
| Refractive Index | 1.508 | 1.5087 | 1.5088 | 1.5088 | 1.5093 | 1.5094 | 1.5097 |

| | H | I | J | K | L | M | O |
|---|---|---|---|---|---|---|---|
| Density (g/cm³) | 2.465 | 2.467 | 2.467 | 2.471 | 2.474 | 2.5434 | 2.471 |
| CTE ($\times 10^{-7}$/° C.) | 71.6 | 70.6 | 69.3 | 69.1 | 67 | 76.2 | 73.4 |
| Strain Pt. (° C.) | 574 | 579 | 581 | 581 | 584 | 576 | 572 |
| Anneal Pt. (° C.) | 626 | 631 | 632 | 634 | 636 | 623 | 624 |
| Softening Pt. (° C.) | 888.6 | 892.7 | 898.2 | 898.9 | 898.6 | 853.4 | 883.9 |
| $10^{11}$ Poise Temperature | 714 | 719 | 720 | 724 | 724 | 702 | 712 |
| Liquidus Viscosity (Poise) | | | | | | | |
| Zircon Breakdown Viscosity (Poise) | 24981 | | | | | | |
| Poissons ratio | 0.205 | 0.212 | 0.208 | 0.214 | 0.213 | | |
| Young's Modulus (GPa) | 78.7 | 79.4 | 79.4 | 79.7 | 80.0 | | |
| Shear Modulus (GPa) | 32.5 | 32.8 | 32.9 | 32.8 | 33.0 | | |
| Stress Optical Coefficient (nm/mm/MPa) | 3.074 | 3.082 | 3.076 | 3.071 | 3.072 | 3.043 | 3.066 |
| Refractive Index | 1.5101 | 1.51 | 1.5103 | 1.5109 | 1.5114 | 1.5181 | 1.5094 |

| | P | Q | R |
|---|---|---|---|
| Density (g/cm³) | 2.473 | 2.477 | 2.477 |
| CTE ($\times 10^{-7}$/° C.) | 72.2 | 71.2 | 69.7 |
| Strain Pt. (° C.) | 574 | 577 | 579 |

TABLE 2-continued

Selected physical properties of the glasses listed in Table 1.

| | | | |
|---|---|---|---|
| Anneal Pt. (° C.) | 625 | 628 | 630 |
| Softening Pt. (° C.) | 884.7 | 887.6 | 888.6 |
| $10^{11}$ Poise Temperature | 712 | 715 | 717 |
| Liquidus Viscosity (Poise) | | | |
| Zircon Breakdown Viscosity (Poise) | | | |
| Poissons ratio | | | |
| Young's Modulus (GPa) | | | |
| Shear Modulus (GPa) | | | |
| Stress Optical Coefficient (nm/mm/MPa) | 3.079 | 3.091 | 3.082 |
| Refractive Index | 1.5099 | 1.5103 | 1.5106 |

Each of the oxide components of the base and ion-exchanged glasses described herein serves a function and/or has an effect on the manufacturability and physical properties of the glass. Silica ($SiO_2$), for example, is the primary glass forming oxide, and forms the network backbone for the molten glass. Pure $SiO_2$ has a low CTE and is alkali metal-free. Due to its extremely high melting temperature, however, pure $SiO_2$ is incompatible with the fusion-draw process. The viscosity curve is also much too high to match with any core glass in a laminate structure. In some embodiments, the glasses described herein comprise from about 60 mol % to about 70 mol % $SiO_2$ and, in other embodiments, from about 62 mol % to about 68 mol % $SiO_2$.

In addition to silica, the glasses described herein comprise the network formers $Al_2O_3$ to achieve stable glass formation, low CTE, low Young's modulus, low shear modulus, and to facilitate melting and forming. Like $SiO_2$, $Al_2O_3$ contributes to the rigidity to the glass network. Alumina can exist in the glass in either fourfold or fivefold coordination, which increases the packing density of the glass network and thus increases the compressive stress resulting from chemical strengthening. In some embodiments, the glasses described herein comprise from about 10 mol % to about 16 mol % $Al_2O_3$ and, in other embodiments, from about 12 mol % to about 14 mol % $Al_2O_3$.

The glasses described herein, in some embodiments, do not contain boron oxide ($B_2O_3$), as its presence has a negative impact on compressive stress when the glass is strengthened by ion-exchange.

The glasses described herein comprise up to about 6 mol % $Li_2O$. In some embodiments, the glass comprises from about 2 mol % to about 10 mol % $Li_2O$ and, in other embodiments, from about 2 mol % to about 6 mol % $Li_2O$ and, in some embodiments, from about 2.5 mol % to about 5.5 mol % $Li_2O$. When substituted for $Na_2O$, $Li_2O$ reduces the zircon breakdown temperature and softens the glass, which allows additional $Al_2O_3$ to be added to the glass. Compared to the other alkali oxides ($Na_2O$, $K_2O$, $Rb_2O$, and $Cs_2O$), $Li_2O$ reduces the viscosity of the glass at a given temperature so that, when offset by the addition of $Al_2O_3$, packing density of the glass is increased and the compressive stress in the ion-exchanged glass is increased. In the glasses described herein, $Li_2O$ accounts for at least about 20% of the overall alkali oxide content of the glass. Thus, $Li_2O(\text{mol }\%)/R_2O(\text{mol }\%) \geq 0.2$, and, in some embodiments, $0.3 \geq Li_2O(\text{mol }\%)/R_2O(\text{mol }\%) \geq 0.2$, where $R_2O = Li_2O + Na_2O + K_2O + Rb_2O + Cs_2O$. In some embodiments, the amount of $Na_2O$ present in the glass exceeds that of $Li_2O$ (i.e., $Li_2O(\text{mol }\%) < Na_2O(\text{mol }\%)$, or $Li_2O(\text{mol }\%)/Na_2O (\text{mol }\%) < 1$ or, in some embodiments, $Li_2O(\text{mol }\%)/Na_2O (\text{mol }\%) < 0.75$.

The alkali oxide $Na_2O$ is used to achieve chemical strengthening of the glass by ion-exchange. The glasses described herein include $Na_2O$, which provides the $Na^+$ cation to be exchanged for potassium cations present in a molten salt bath containing, for example, $KNO_3$. In some embodiments, the glass comprises from about 8 mol % to about 13 mol % $Na_2O$ and, in some embodiments, from about 9 mol % to about 13 mol % $Na_2O$.

The presence of potassium oxide in the glass has a negative effect on the ability of to achieve high levels of surface compressive stress in the glass through ion-exchange. The glasses described herein, as originally formed, therefore do not contain—or are free of—$K_2O$. However, when ion-exchanged in a potassium-containing molten salt (e.g., containing $KNO_3$) bath, $K_2O$ (less than about 1 mol %) may be added, with the actual amount depending upon ion-exchange conditions (e.g., potassium salt concentration in the ion-exchange bath, bath temperature, ion-exchange time, and the extent to which $K^+$ ions replace $Li^+$ and/or $Na^+$ ions). The resulting compressive layer will contain potassium; the ion-exchanged layer near the surface of the glass may contain 10 mol % or more $K_2O$ at the glass surface, while the bulk of the glass at depths greater than the depth of the compressive layer remains essentially potassium-free.

The glasses described herein may comprise from about 2 mol % up to about 6 mol % ZnO and, in other embodiments, from about 2 mol % up to about 5 mol % ZnO and, in still other embodiments, from about 2.5 mol % up to about 4.5 mol % ZnO. The divalent oxide ZnO improves the melting behavior of the glass by reducing the temperature at 200 poise viscosity (200 P temperature, or $T^{200\,P}$). Compared to $P_2O_5$, and/or $Na_2O$, ZnO is more beneficial in improving the strain point of the glass.

MgO may be substituted for ZnO to achieve a similar effect on the strain point. In some embodiments, the glasses described herein include from greater than 0 mol % up to about 6 mol % MgO, in other embodiments, from 0 mol % up to about 3 mol % MgO or, in still other embodiments, these glasses comprise greater than 0 mol % to about 2.5 mol % MgO. While other alkaline earth oxides, including CaO, SrO, and BaO, may also be substituted for ZnO, they are less effective in reducing the melt temperature at 200 poise viscosity than ZnO or MgO and are also less effective than ZnO and MgO at increasing the strain point. The glasses described herein are thus, in some embodiments, free of CaO, SrO and BaO.

In some embodiments, the alkali aluminosilicate glasses described herein are formable by down-draw processes that are known in the art, for example, slot-draw and fusion-draw processes. Glass compositions containing 6 mol % or less of $Li_2O$ are fully compatible with the fusion-draw process and can be manufactured without issue. The lithium may, in some embodiments, be batched in the melt as either spodumene or lithium carbonate.

The fusion-draw process is an industrial technique that has been used for the large-scale manufacture of thin glass sheets. Compared to other flat glass manufacturing techniques, for example, the float or slot-draw processes, the fusion-draw process yields thin glass sheets with superior flatness and surface quality. As a result, the fusion-draw process has become the dominant manufacturing technique in the fabrication of thin glass substrates for liquid crystal displays, as well as for cover glass for personal electronic devices such as, but not limited to, notebooks, entertainment devices, tables, laptops, and the like.

The fusion-draw process, as most commonly practiced, involves the flow of molten glass over a glass-forming device known as an "isopipe," which is typically made of zircon or another refractory material. The molten glass flows into a trough having two sides and then overflows the top of the isopipe from both sides, meeting at the bottom of the isopipe to form a single sheet where only the interior of the final sheet has made direct contact with the isopipe. Since neither exposed surface of the final glass sheet has made contact with the isopipe material during the draw process, both outer surfaces of the glass are of pristine quality, without necessarily requiring subsequent finishing for example polishing and/or grinding.

The glasses described herein are chemically compatible with the zircon isopipe and other hardware used in down-draw processes; i.e., the glass melt does not appreciably react with the isopipe and hardware to cause zircon to decompose, giving rise to solid inclusions such as zirconia in the drawn glass. In such embodiments, $T^{breakdown}$—the temperature at which zircon breaks down and reacts with the glass melt—is greater than the temperature at which the viscosity of the glass or glass melt is 35 kP ($T^{35\ kP}$); i.e., $T^{breakdown} > T^{35\ kP}$.

In order to be fusion-drawable, a glass must have a sufficiently high liquidus viscosity (i.e., the viscosity of a molten glass at the liquidus temperature). In some embodiments, the glasses described herein have a liquidus viscosity of at least about 200 kilopoise (kP) and, in other embodiments, at least about 500 kP.

In another aspect, the glasses described hereinabove are chemically strengthened to provide a strengthened glass. Ion-exchange is widely used to chemically strengthen glasses. In one particular example, alkali cations within a source of such cations (e.g., a molten salt, or "ion-exchange," bath) are exchanged with smaller alkali cations within the glass to achieve a layer that is under a compressive stress (CS) near the surface of the glass. The compressive layer extends from the surface to a depth of layer (DOL) or compression within the glass. In the glasses described herein, for example, potassium ions from the cation source are exchanged for sodium and lithium ions within the glass during ion-exchange by immersing the glass in a molten salt bath comprising a potassium salt such as, but not limited to, potassium nitrate ($KNO_3$). Other potassium salts that may be used in the ion-exchange process include, but are not limited to, potassium chloride (KCl), potassium sulfate ($K_2SO_4$), combinations thereof, and the like. The ion-exchange baths described herein may contain alkali ions other than potassium and the corresponding salts. For example, the ion-exchange bath may also include sodium salts such as, but not limited to, sodium nitrate, sodium sulfate, sodium chloride, or the like.

A cross-sectional schematic view of a planar ion-exchanged glass article is shown in FIG. 1. Glass article 100 has a thickness t, first surface 110, and second surface 112, with the thickness t being in a range from about 0.010 mm (10 μm) to about 0.150 mm (150 μm) or, in some embodiments, in a range from about 0.010 mm (10 μm) to about 0.125 mm (125 μm) or, in still other embodiments, in a range from about 0.010 mm (10 μm) to about 0.100 mm (100 μm) or, in still other embodiments, in a range from about 0.010 mm (10 μm) to about 0.075 mm (75 μm) or, in still other embodiments, in a range from about 0.020 mm (20 μm) to about 0.100 mm (100 μm) or, in still other embodiments, in a range from about 0.030 mm (30 μm) to about 0.100 mm (100 μm) or, in still other embodiments, in a range from about 0.040 mm (40 μm) to about 0.100 mm (100 μm) or, in still other embodiments, in a range from about 0.050 mm (50 μm) to about 0.100 mm (100 μm) or, in still other embodiments, in a range from about 0.060 mm (60 μm) to about 0.100 mm (100 μm) or, in still other embodiments, in a range from about 0.070 mm (70 μm) to about 0.100 mm (100 μm) or, in still other embodiments, in a range from about 0.080 mm (80 μm) to about 0.100 mm (100 μm). While the embodiment shown in FIG. 1 depicts glass article 100 as a flat planar sheet or plate, glass article may have other configurations, for example three dimensional shapes or non-planar configurations. Glass article 100 has a first compressive layer 120 extending from first surface 110 to a depth of layer $d_1$ into the bulk of the glass article 100. In the embodiment shown in FIG. 1, glass article 100 also has a second compressive layer 122 extending from second surface 112 to a second depth of layer $d_2$. Glass article 100 also has a central region 330 that extends from $d_1$ to $d_2$. Central region 130 is under a tensile stress or central tension (CT), which balances or counteracts the compressive stresses of layers 120 and 122. The depth $d_1$, $d_2$ of first and second compressive layers 120, 122 protects the glass article 100 from the propagation of flaws introduced by sharp impact to first and second surfaces 110, 112 of glass article 100, while the compressive stress minimizes the likelihood of a flaw penetrating through the depth $d_1$, $d_2$ of first and second compressive layers 120, 122.

In one embodiment, the ion-exchanged glass having the composition described hereinabove has a thickness t of about 1 mm. Each or compressive layers 120, 122 extend from surfaces 110, 122, respectively, of the glass 100 to depths of layer $d_1$, $d_2$ of up to 30 μm. Each compressive layer has a maximum compressive stress CS at the surface of at least 950 MPa. In some embodiments, the maximum compressive stress is at least about 1000 MPa and, in still other embodiments, at least about 1100 MPa. In certain embodiments, the maximum compressive stress is in a range from about 950 MPa to about 1250 MPa and, in other embodiments, in a range from about 1000 MPa to about 1250 MPa.

The glasses listed in Table 1 were ion-exchanged under different ion-exchange conditions and the resulting compressive stresses and depths of layer were compared to those obtained for a control glass having a nominal composition of 68.96 mol % $SiO_2$, 0 mol % $B_2O_3$, 10.28 mol % $Al_2O_3$, 15.21 mol % Na$_2$O, 0.012 mol % K$_2$O, 5.37 mol % MgO, 0 mol % CaO, and 0.17 mol % SnO$_2$. The ion-exchange samples each had a thickness of 1 mm and a fictive temperature of 10$^{11}$ Poise. In one set of experiments, the glasses of Table 1 and the control glass were ion-exchanged in a pure (100% by weight) KNO$_3$ bath at 410° C. for 45 minutes. Maximum compressive stress, depth of compressive layer, and percentage increase in compressive stress with respect to the control sample for these experiments are listed in Table 3.

In the second set of ion-exchange experiments, the glasses of Table 1 and the control glass were ion-exchanged in a pure KNO$_3$ bath at 410° C. for 8 hours. Maximum compressive stress, depth of compressive layer, and percentage increase in compressive stress with respect to the control sample for these experiments are listed in Table 4.

Under the ion-exchange conditions studied, the alkali aluminosilicate glasses described herein were ion-exchanged to achieve compressive stresses that were substantially greater than that obtained for the control glass. For example, compressive stress observed for compositions G-P and R exceeded 1100 MPa when ion-exchanged at 410° C. for 45 minutes, compared to the compressive stress of 1007 MPa observed for the control glass.

TABLE 3

Results for samples having 1.0 mm thickness following ion-exchange in a 100% KNO$_3$ bath at 410° C. for 45 minutes.

| Sample | A | B | C | D | E | F | G |
|---|---|---|---|---|---|---|---|
| Magnitude of Compressive Stress (MPa) | 1073 | 1059 | 1097 | 1073 | 1096 | 1096 | 1155 |
| Depth of Layer (microns) | 10 | 10 | 9 | 9 | 8 | 8 | 8 |
| % CS increase over 2319 control | 7 | 5 | 9 | 7 | 9 | 9 | 15 |

| Sample | H | I | J | K | L | M | O |
|---|---|---|---|---|---|---|---|
| Magnitude of Compressive Stress (MPa) | 1188 | 1203 | 1174 | 1167 | 1146 | 1150 | 1110 |
| Depth of Layer (microns) | 8 | 8 | 7 | 7 | 7 | 7 | 9 |
| % CS increase over 2319 control | 18 | 19 | 17 | 16 | 14 | 14 | 10 |

| Sample | P | Q | R | Control |
|---|---|---|---|---|
| Magnitude of Compressive Stress (MPa) | 1115 | 1092 | 1101 | 1007 |
| Depth of Layer (microns) | 9 | 8 | 8 | 14 |
| % CS increase over 2319 control | 11 | 8 | 9 | |

TABLE 4

Results for samples having 1.0 mm thickness following ion-exchange in a 100% KNO$_3$ bath at 410° C. for 8 hours.

| Sample | A | B | C | D | E | F | G |
|---|---|---|---|---|---|---|---|
| Magnitude of Compressive Stress (MPa) | 1001 | 981 | | 1015 | 1020 | 1020 | 1038 |
| Depth of Layer (microns) | 29 | 31 | | 29 | 29 | 27 | 28 |
| % CS increase over Control | 11 | 9 | | 13 | 13 | 13 | 15 |

| Sample | H | I | J | K | L | M | O |
|---|---|---|---|---|---|---|---|
| Magnitude of Compressive Stress (MPa) | 1046 | 1060 | 1064 | 1064 | 1075 | | 1020 |
| Depth of Layer (microns) | 27 | 26 | 25 | 24 | 22 | | 29 |
| % CS increase over Control | 16 | 18 | 18 | 18 | 19 | | 13 |

| Sample | P | Q | R | Control |
|---|---|---|---|---|
| Magnitude of Compressive Stress (MPa) | 1034 | 1029 | 1036 | 901 |
| Depth of Layer (microns) | 27 | 26 | 26 | 44.2 |
| % CS increase over Control | 15 | 14 | 15 | |

In some embodiments, the ion-exchanged glass has a thickness t of about 150 µm (0.150 mm) or less, or about 125 µm (125 mm) or less, or about 100 µm or less and has a maximum compressive stress at the surface of at least about 950 MPa and, in some embodiments, at least about 1000 MPa. In some embodiments, the depth of the compressive layer in these glasses is about 0.25 t and, in some embodiments, the depth of layer is 10 µm or less. When bent to a bend radius of about 3.6 mm or less and subjected to a bend-induced stress, the superimposed or effective depth of layer (for compression in the glass) of these ion-exchanged glasses is about 1 µm or less at the outer surface of the bend.

Figure 2:
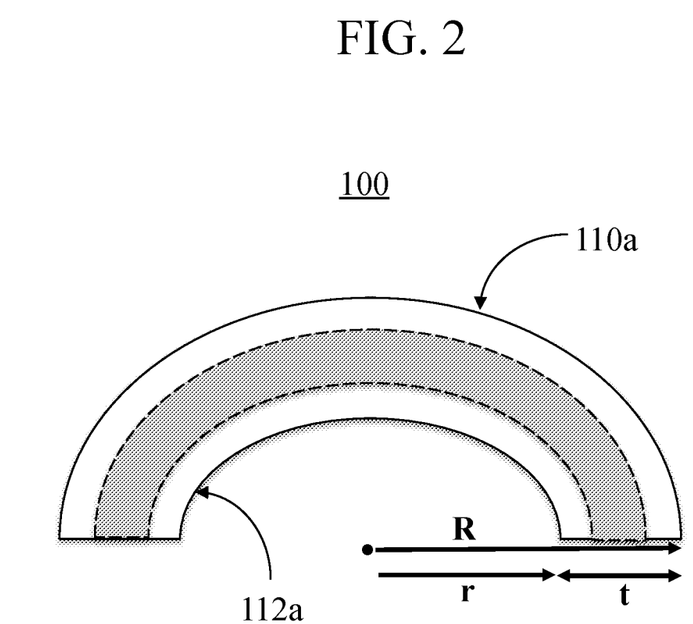
FIG. 2 is a cross-sectional schematic view of an ion-exchanged glass article under bend-induced stress.

FIG. 2 is a schematic cross-sectional view of an ion-exchanged glass sheet under bend-induced stress. When bent to a bend radius R, the outer surface 110a of the ion-exchanged glass sheet 100 is subjected to a tensile stress, induced by the bend, which causes the depth of layer of the compressive layer on the outer surface 110a to decrease to an effective depth of layer, while the inner surface 112a is subjected to additional compressive stress. The effective depth of layer to which the glass is subject to compression on the outer surface 110a increases with increasing bend radii and decreases with decreasing bend radii.

When bending a thin glass plate, the bend-induced stress is given by the equation $$\sigma = \frac{E}{1-\upsilon^2} \frac{h}{2} \frac{1}{R}, \tag{1}$$

where σ is the tensile stress on the outer surface of the glass, E is the Young's modulus of the glass, υ is Poisson's ratio, h is the thickness of the glass (corresponding to t in FIG. 1), and R is the bend radius of the outer surface of the glass. The bend-induced stress may be calculated for various bend radii R by using the Young's modulus and Poisson's ratios (which are dependent upon glass composition and not upon radius) listed in Table 2 and a glass thickness of 75 µm.

Figure 3:
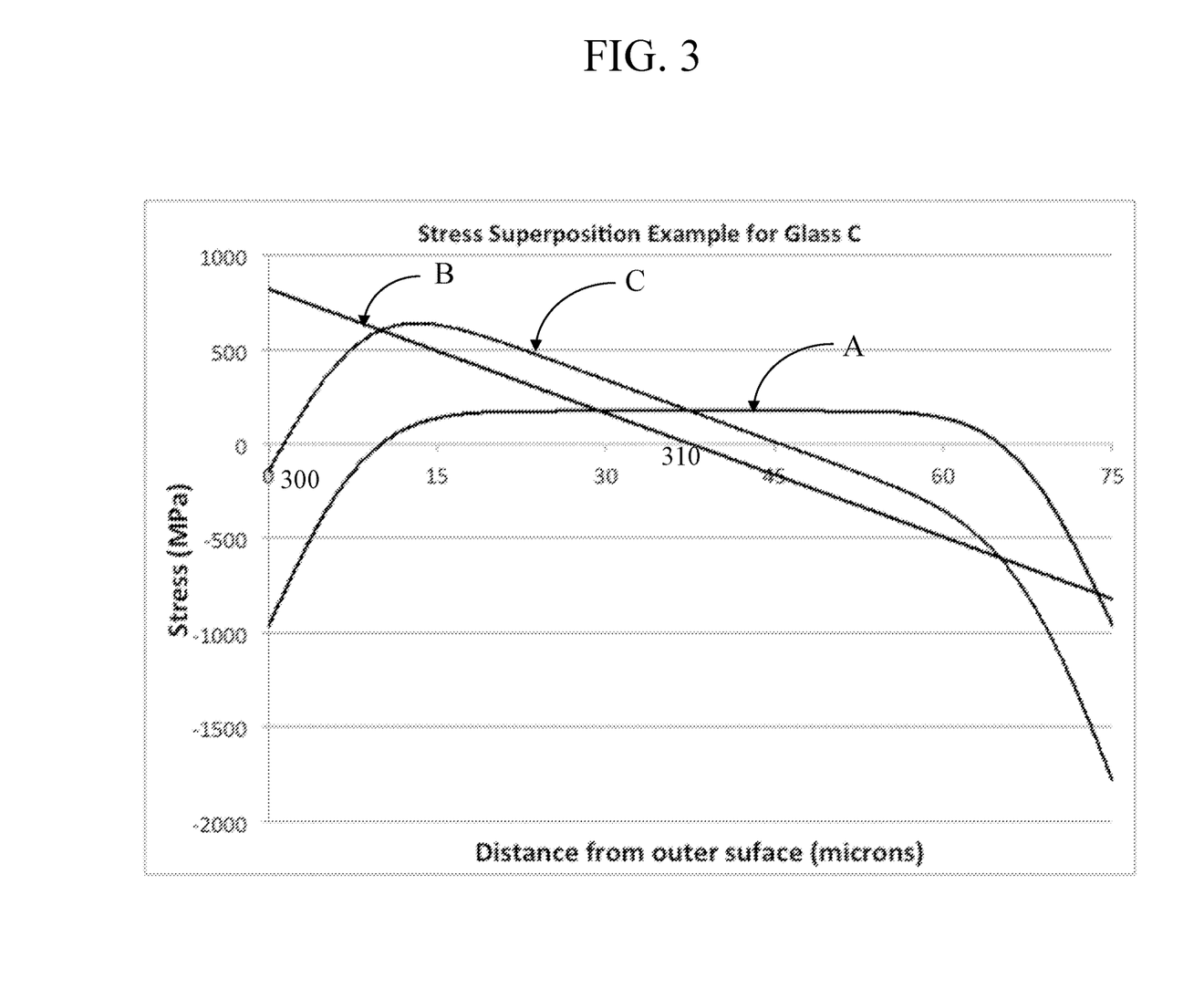
FIG. 3 is a plot of showing superposition of ion-exchange and bend-induced stresses in a glass article under bend-induced stress.

The bend-induced stress can be superimposed with the ion-exchanged compressive stress to yield the net stress profile (which has an effective depth of layer at the outer surface) for a given bend radius R, which is the sum of the thickness t and inner radius r in FIG. 2. FIG. 3 shows the superposition of these stresses determined for a 75 µm thick glass sample having composition C as given in Table 1. As shown in FIG. 3, compressive stress is negative (<0) and tensile stress is positive (>0). Ion-exchanged stress (A), bend-induced tensile stress (B), and the net stress (C) as a function of distance from the outer surface (110a in FIG. 2) of a 75 μm thick sample of glass C are plotted in FIG. 3. The outer surface of the glass was bent to a bend radius R of 3.58 mm, at which point the effective depth of the compressive layer at the outer surface is reduced from 10 μm to 1 μm (300 in FIG. 3). The ion-exchange profile (A) follows a complementary error function, and has a maximum compressive stress of −945 MPa and depth of compressive layer of 10 μm. Using equation (1) above, the bend-induced tensile stress is calculated to be +842 MPa at the outer surface 110a when the outer surface bend radius R is 3.58 mm. The compressive stress on the inner surface is therefore equal to −842 MPa. The plot of bend-induced stress B is linear with distance from the outer to the inner surface and is zero at half the sample thickness (310 in FIG. 3). The superposition of these stresses show that, for an outer surface bend radius R of 3.58 mm, the effective depth of the compressive layer on the outer surface of the glass is reduced to 1 μm.

With careful handling and processing of the glass, the flaw size on the outer surface can be limited to less than 1 μm, thus making the glass resistant to bend-induced failure, as the effective depth of layer is 1 μm during bending. Since the outer surface having the 1 μm effective depth of layer is typically protected within a foldable device, this depth of layer is considered adequate for repeated bending to the 3.58 mm bend radius. In comparison, superposition of the control glass shows that bend-induced reduction of the depth of layer to an effective depth of 1 μm requires a larger outer surface bend radius R of 3.67 mm.

Ion-exchange data for 75 mm-thick glasses C and E-L listed Table 1 and the control glass and the outer surface bend radius R that reduces the effective depth of the compressive layer DOL from 10 μm to 1 μm are listed in Table 5. All samples have a thickness of 75 μm and were ion-exchanged in a 100% KNO₃ bath at 410° C. The higher surface compressive stress of samples C and E-L in Table 5 allows a tighter bend radius R, which produces an effective depth of layer of 1 μm.

TABLE 5

Compressive stresses and bend radii R that produce an effective depth of layer of 1 μm on outer surface for samples having 75 μm thickness following ion-exchange in a 100% KNO₃ bath at 410° C.

| Sample | C | E | F | G | H |
|---|---|---|---|---|---|
| Magnitude of Compressive Stress (MPa) | 945 | 940 | 940 | 1000 | 1035 |
| Bend radius R (mm) that reduces effective DOL from 10 μm to 1 μm | 3.58 | 3.62 | 3.62 | 3.47 | 3.35 |

| Sample | I | J | K | L | Control |
|---|---|---|---|---|---|
| Magnitude of Compressive Stress (MPa) | 1050 | 1020 | 1015 | 990 | 853 |
| Bend radius R (mm) that reduces effective DOL from 10 μm to 1 μm | 3.34 | 3.43 | 3.47 | 3.56 | 3.67 |

Figure 4:
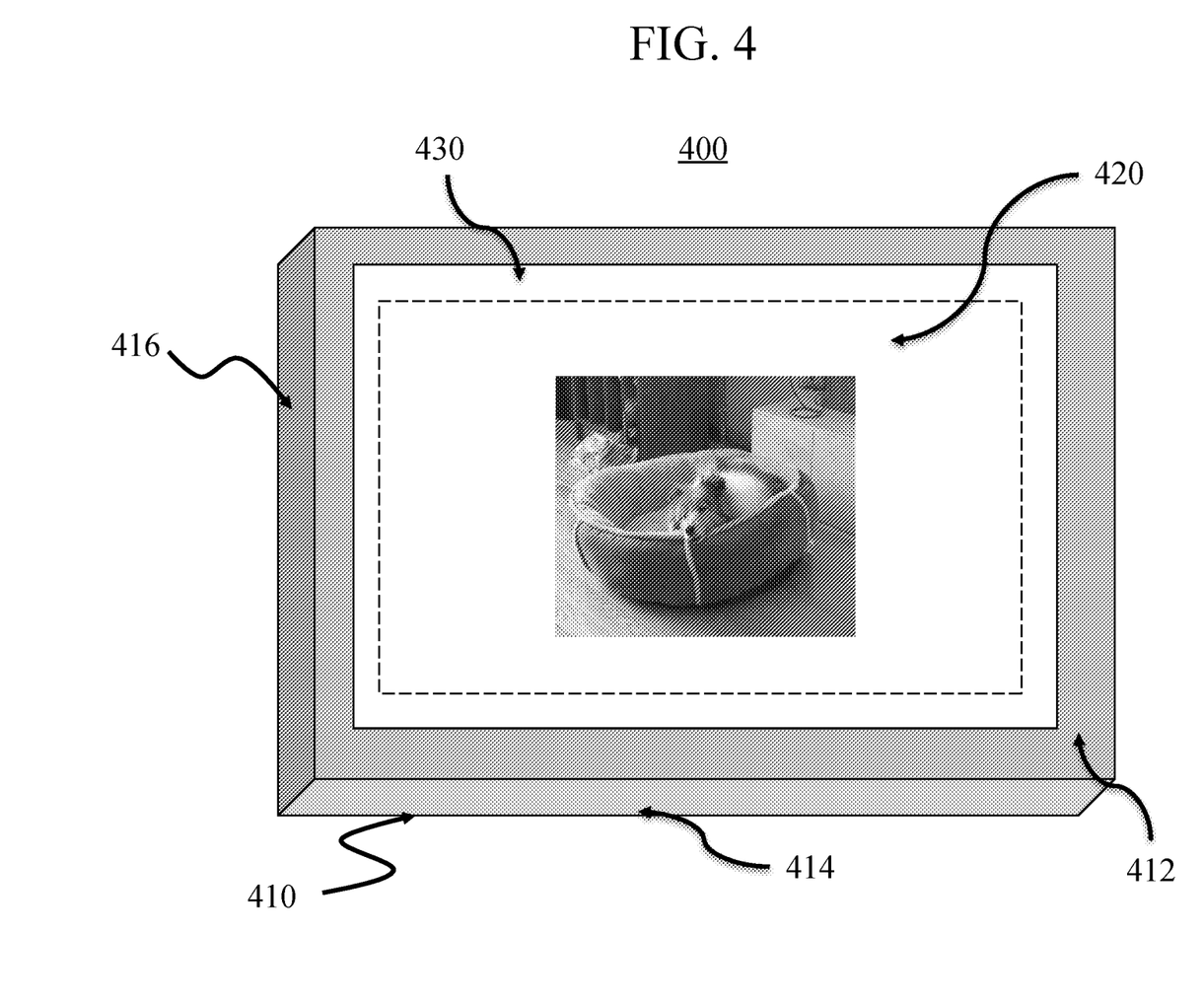
FIG. 4 is a schematic view of a consumer electronic product.

In some embodiments, the glass article and ion-exchanged glass described herein form a portion of a consumer electronic product, for example a cellular phone or smart phone, laptop computers, tablets, or the like. A schematic view of a consumer electronic product (e.g., a smart phone) is shown in FIG. 4. Consumer electronic product 400 typically comprises a housing 410 having a front surface 412, a back surface 414, and side surfaces 416; and includes electrical components (not shown), which are at least partially internal to the housing 410. The electrical components include at least a power source, a controller, a memory, and a display 420. The display 420 is, in some embodiments, provided at or adjacent the front surface 412 of the housing. A cover glass 430, which comprises the ion-exchanged glass described herein, is provided at or over the front surface 412 of the housing 400 such that the cover glass 430 is positioned over the display 420 and protects the display 420 from damage caused by impact or damage. In some embodiments, the display 420 and/or cover glass 430 are bendable.

While typical embodiments have been set forth for the purpose of illustration, the foregoing description should not be deemed to be a limitation on the scope of the disclosure or appended claims. Accordingly, various modifications, adaptations, and alternatives may occur to one skilled in the art without departing from the spirit and scope of the present disclosure or appended claims. Further Exemplary embodiments include the following.

Embodiment 1. A glass article comprising an alkali aluminosilicate glass, the alkali aluminosilicate glass comprising Li2O, Na2O, MgO, and ZnO, wherein Li2O(mol %)/R2O(mol %)≥0.2, where R2O=Li2O+Na2O+K2O+Rb2O+Cs2O, and wherein the alkali aluminosilicate glass is free of P2O5 and is ion-exchangeable.

Embodiment 2. The glass article of embodiment 1, wherein the alkali aluminosilicate glass has a thickness t of up to about 1 mm and is ion-exchangeable to achieve a compressive layer extending from a surface of the alkali aluminosilicate glass to a depth of layer of up to about 30 μm and a maximum compressive stress of at least about 950 MPa at the surface.

Embodiment 3. The glass article of embodiment 1 or embodiment 2, wherein the thickness t is about 125 μm or less.

Embodiment 4. The glass article of any one of embodiments 1-3, wherein the depth of layer is about 0.25 t or less.

Embodiment 5. The glass article of any one of embodiments 1-4, wherein the depth of layer is about 10 μm or less.

Embodiment 6. The glass article of any one of embodiments 1-5, wherein the compressive stress is at least about 1000 MPa.

Embodiment 7. The glass article of any one of embodiments 1-6, wherein the alkali aluminosilicate glass has an effective depth of layer of less than or equal to about 1 μm when the alkali aluminosilicate glass is bent to a bend radius of about 3.6 mm or less.

Embodiment 8. The glass article of any one of embodiments 1-7, wherein the alkali aluminosilicate glass has a liquidus viscosity of at least about 500 kP.

Embodiment 9. The glass article of any one of embodiments 1-8, wherein the alkali aluminosilicate glass has a zircon breakdown temperature Tbreakdown and a 35 kPoise temperature T35 kP, wherein Tbreakdown is greater than T35 kP.

Embodiment 10. The glass article of any one of embodiments 1-9, wherein the alkali aluminosilicate glass is downdrawable.

Embodiment 11. The glass article of any one of embodiments 1-10, wherein the alkali aluminosilicate glass comprises: from about 60 mol % to about 70 mol % SiO2; from about 10 mol % to about 16 mol % Al2O3; from about 2 mol % to about 10 mol % Li2O; from about 8 mol % to about 13 mol % Na2O; from greater than 0 mol % to about 6 mol % MgO; and from about 2 mol % to about 6 mol % ZnO.

Embodiment 12. The glass article of any one of embodiments 1-10, wherein the alkali aluminosilicate glass comprises: from about 62 mol % to about 68 mol % SiO2; from about 12 mol % to about 14 mol % Al2O3; from about 2 mol % to about 6 mol % Li2O; from about 8 mol % to about 13 mol % Na2O; from greater than 0 mol % to about 3 mol % MgO; and from about 2 mol % to about 5 mol % ZnO.

Embodiment 13. The glass article of any one of embodiments 1-12, wherein the alkali aluminosilicate glass is free of at least one of B2O3, K2O, and CaO.

Embodiment 14. The glass article of any one of embodiments 1-13, wherein the glass article forms at least a portion of a cover glass for a consumer electronic device, the consumer electronic device comprising a housing; electrical components provided at least partially internal to the housing, the electrical components including at least a controller, a memory, and a display, the display being provided at or adjacent to a front surface of the housing; wherein the cover glass is provided at or over the front surface of the housing and over the display.

Embodiment 15. An ion-exchanged glass, wherein the ion-exchanged glass has a thickness t of up to about 1 mm and is an alkali aluminosilicate glass comprising Li2O, Na2O, MgO, and ZnO, wherein Li2O(mol %)/R2O(mol %)≥0.2, where R2O=Li2O+Na2O+K2O+Rb2O+Cs2O, and wherein the alkali aluminosilicate glass is free of P2O5, the ion-exchanged glass having a compressive layer extending from a surface of the glass to a depth of layer of up to about 30 μm within the glass, and wherein the compressive layer has a maximum compressive stress at the surface of at least about 950 MPa.

Embodiment 16. The ion-exchanged glass of embodiment 15, wherein the maximum compressive stress is at least about 1000 MPa.

Embodiment 17. The ion-exchanged glass of embodiment 15 or embodiment 16, wherein the thickness t is about 125 μm or less, and wherein the depth of layer of the ion-exchanged glass is about 0.25 t or less.

Embodiment 18. The ion-exchanged glass of any one of embodiments 15-17, wherein the depth of layer is about 10 μm or less.

Embodiment 19. The ion-exchanged glass of any one of embodiments 15-18, wherein the alkali aluminosilicate glass has an effective depth of layer of less than or equal to about 1 μm when the ion-exchanged glass is bent to a bend radius of about 3.6 mm or less.

Embodiment 20. The ion-exchanged glass of any one of embodiments 15-19, wherein the alkali aluminosilicate glass comprises: from about 60 mol % to about 70 mol % SiO2; from about 10 mol % to about 16 mol % Al2O3; from about 2 mol % to about 10 mol % Li2O; from about 8 mol % to about 13 mol % Na2O; from greater than 0 mol % to about 6 mol % MgO; and from about 2 mol % to about 6 mol % ZnO.

Embodiment 21. The ion-exchanged glass of any one of embodiments 15-18, wherein the ion-exchanged glass comprises: from about 62 mol % to about 68 mol % SiO2; from about 12 mol % to about 14 mol % Al2O3; from about 2 mol % to about 6 mol % Li2O; from about 8 mol % to about 13 mol % Na2O; from greater than 0 mol % to about 3 mol % MgO; and from about 2 mol % to about 5 mol % ZnO.

Embodiment 22. The ion-exchanged glass of any one of embodiments 15-21, wherein the ion-exchanged glass is free of at least one of B2O3, K2O, and CaO.

Embodiment 23. The ion-exchanged glass of any one of embodiments 15-22, wherein the ion-exchanged glass forms at least a portion of a cover glass for a consumer electronic device, the consumer electronic device comprising a housing; electrical components provided at least partially internal to the housing, the electrical components including at least a controller, a memory, and a display, the display being provided at or adjacent to a front surface of the housing; wherein the cover glass is provided at or over the front surface of the housing and over the display.

Embodiment 24. An alkali aluminosilicate glass comprising: from about 60 mol % to about 70 mol % SiO2; from about 10 mol % to about 16 mol % Al2O3; from about 2 mol % to about 10 mol % Li2O; from about 8 mol % to about 13 mol % Na2O; from greater than 0 mol % to about 6 mol % MgO; and from about 2 mol % to about 6 mol % ZnO, wherein the alkali aluminosilicate glass is free of P2O5, and wherein the alkali aluminosilicate glass has a thickness t of about 125 μm or less and is ion-exchangeable to achieve a compressive stress at a surface of the alkali aluminosilicate glass of at least about 950 MPa and a depth of layer of a compressive layer of about 0.25 t or less, the compressive layer extending from the surface to the depth of layer.

Embodiment 25. The alkali aluminosilicate glass of embodiment 24, wherein the alkali aluminosilicate glass comprises: from about 62 mol % to about 68 mol % SiO2; from about 12 mol % to about 14 mol % Al2O3; from about 2 mol % to about 6 mol % Li2O; from about 8 mol % to about 13 mol % Na2O; from greater than 0 mol % to about 3 mol % MgO; and from about 2 mol % to about 5 mol % ZnO, wherein Li2O(mol %)/R2O(mol %)≥0.2, where R2O=Li2O+Na2O+K2O+Rb2O+Cs2O.

Embodiment 26. The alkali aluminosilicate glass of embodiment 24 or embodiment 25, wherein the alkali aluminosilicate glass has a liquidus viscosity of at least about 500 kP.

Embodiment 27. The alkali aluminosilicate glass of any one of embodiments 24-26, wherein the alkali aluminosilicate glass has a zircon breakdown temperature Tbreakdown and a 35 kPoise temperature T35 kP, wherein Tbreakdown is greater than T35 kP.

Embodiment 28. The alkali aluminosilicate glass of any one of embodiments 24-27, wherein the alkali aluminosilicate glass is down-drawable.

Embodiment 29. The alkali aluminosilicate glass of any one of embodiments 24-28, wherein the compressive stress is at least about 1000 MPa.

Embodiment 30. The alkali aluminosilicate glass of any one of embodiments 24-29, wherein the alkali aluminosilicate glass has an effective depth of layer of less than or equal to to about 1 μm, when the alkali aluminosilicate glass is bent to a bend radius of about 3.6 mm or less.

The invention claimed is:

1. A glass article comprising an alkali aluminosilicate glass, the alkali aluminosilicate glass comprising 2.5 mol % to 5.5 mol % $Li_2O$, 8 mol % to 13 mol % $Na_2O$, MgO, ZnO, and greater than 12 mol % to 14 mol % $Al_2O_3$, wherein $Li_2O$(mol %)/$R_2O$(mol %)≥0.2, where $R_2O=Li_2O+Na_2O+K_2O+Rb_2O+Cs_2O$, wherein $R_2O$ is greater than or equal to 13 mol %, wherein 0.75>$Li_2O$(mol %)/$Na_2O$(mol %)≥0.50, and wherein the alkali aluminosilicate glass is free of $P_2O_5$ and $B_2O_3$, wherein the alkali aluminosilicate glass has an effective depth of layer of more than or equal to 1 μm when the alkali aluminosilicate glass is bent to a bend radius of 3.6 mm or less, wherein the alkali aluminosilicate glass has a thickness t of 125 µm or less and is ion-exchanged to achieve a compressive layer extending from a surface of the alkali aluminosilicate glass to a depth of layer of up to 30 µm and a maximum compressive stress of at least 950 MPa at the surface.

2. The glass article of claim 1, wherein the depth of layer is about 0.25 t or less.

3. The glass article of claim 2, wherein the depth of layer is about 10 µm or less.

4. The glass article of claim 1, wherein the compressive stress is at least about 1000 MPa.

5. The glass article of claim 1, wherein the alkali aluminosilicate glass has a liquidus viscosity of at least about 500 kP.

6. The glass article of claim 1, wherein the alkali aluminosilicate glass has a zircon breakdown temperature $T^{breakdown}$ and a 35 kPoise temperature $T^{35\ kP}$, wherein $T^{breakdown}$ is greater than $T^{35\ kP}$.

7. The glass article of claim 1, wherein the alkali aluminosilicate glass is down-drawable.

8. The glass article of claim 1, wherein the alkali aluminosilicate glass comprises: from about 60 mol % to about 70 mol % $SiO_2$; from greater than 0 mol % to about 6 mol % MgO; and from about 2 mol % to about 6 mol % ZnO.

9. The glass article of claim 1, wherein the alkali aluminosilicate glass comprises: from about 62 mol % to about 68 mol % $SiO_2$; from greater than 0 mol % to about 3 mol % MgO; and from about 2 mol % to about 5 mol % ZnO.

10. The glass article of claim 1, wherein the alkali aluminosilicate glass is free of at least one of $K_2O$ and CaO.

11. The glass article of claim 1, wherein the glass article forms at least a portion of a cover glass for a consumer electronic device, the consumer electronic device comprising a housing; electrical components provided at least partially internal to the housing, the electrical components including at least a controller, a memory, and a display, the display being provided at or adjacent to a front surface of the housing; wherein the cover glass is provided at or over the front surface of the housing and over the display.

12. An ion-exchanged glass, wherein the ion-exchanged glass is an alkali aluminosilicate glass comprising 2.5 mol % to 5.5 mol % $Li_2O$, 8 mol % to 13 mol % $Na_2O$, MgO, ZnO, and 12 mol % to 14 mol % $Al_2O_3$, wherein $Li_2O$(mol %)/$R_2O$(mol %)≥0.2, where $R_2O=Li_2O+Na_2O+K_2O+Rb_2O+Cs_2O$, wherein $R_2O$ is greater than or equal to 13 mol %, wherein 0.75>$Li_2O$(mol %)/$Na_2O$(mol %)≥0.50, and wherein the alkali aluminosilicate glass is free of $P_2O_5$ and $B_2O_3$, the ion-exchanged glass having a compressive layer extending from a surface of the glass to a depth of layer of up to about 30 µm within the glass, and wherein the compressive layer has a maximum compressive stress at the surface of at least about 950 MPa, wherein the alkali aluminosilicate glass has an effective depth of layer of more than or equal to 1 µm when the alkali aluminosilicate glass is bent to a bend radius of 3.6 mm or less, wherein the ion-exchanged glass has a thickness t of 125 pm or less.

13. The ion-exchanged glass of claim 12, wherein the maximum compressive stress is at least about 1000 MPa.

14. The ion-exchanged glass of claim 12, wherein the depth of layer of the ion-exchanged glass is about 0.25 t or less.

15. The ion-exchanged glass of claim 14, wherein the depth of layer is about 10 µm or less.

16. The ion-exchanged glass of claim 12, wherein the alkali aluminosilicate glass comprises: from about 60 mol % to about 70 mol % $SiO_2$; from greater than 0 mol % to about 6 mol % MgO; and from about 2 mol % to about 6 mol % ZnO.

17. The ion-exchanged glass of claim 12, wherein the ion-exchanged glass comprises: from about 62 mol % to about 68 mol % $SiO_2$; from greater than 0 mol % to about 3 mol % MgO; and from about 2 mol % to about 5 mol % ZnO.

18. The ion-exchanged glass of claim 12, wherein the ion-exchanged glass is free of at least one of $K_2O$ and CaO.

19. The ion-exchanged glass of claim 12, wherein the ion-exchanged glass forms at least a portion of a cover glass for a consumer electronic device, the consumer electronic device comprising a housing; electrical components provided at least partially internal to the housing, the electrical components including at least a controller, a memory, and a display, the display being provided at or adjacent to a front surface of the housing; wherein the cover glass is provided at or over the front surface of the housing and over the display.

20. An alkali aluminosilicate glass comprising: from about 60 mol % to about 70 mol % $SiO_2$; greater than 12 mol % to about 14 mol % $Al_2O_3$; from about 2.5 mol % to about 5.5 mol % $Li_2O$ from about 8 mol % to about 13 mol % $Na_2O$; from greater than 0 mol % to about 6 mol % MgO; and from about 2 mol % to about 6 mol % ZnO, wherein $R_2O$ is greater than or equal to 13 mol %, where $R_2O=Li_2O+Na_2O+K_2O+Rb_2O+Cs_2O$, wherein 0.75>$Li_2O$ (mol %)/$Na_2O$(mol %)≥0.50, wherein the alkali aluminosilicate glass is free of $P_2O_5$ and $B_2O_3$, and wherein the alkali aluminosilicate glass has a thickness t of about 125 µm or less and is ion-exchanged to achieve a compressive stress at a surface of the alkali aluminosilicate glass of at least about 950 MPa and a depth of layer of a compressive layer of about 0.25 t or less, the compressive layer extending from the surface to the depth of layer, wherein the alkali aluminosilicate glass has an effective depth of layer of more than or equal to 1 µm when the alkali aluminosilicate glass is bent to a bend radius of 3.6 mm or less.

21. The alkali aluminosilicate glass of claim 20, wherein the alkali aluminosilicate glass comprises: from about 62 mol % to about 68 mol % $SiO_2$; from greater than 0 mol % to about 3 mol % MgO; and from about 2 mol % to about 5 mol % ZnO, wherein $Li_2O$ (mol %)/$R_2O$(mol %)≥0.2.

22. The alkali aluminosilicate glass of claim 20, wherein the alkali aluminosilicate glass has a liquidus viscosity of at least about 500 kP.

23. The alkali aluminosilicate glass of claim 20, wherein the alkali aluminosilicate glass has a zircon breakdown temperature $T^{breakdown}$ and a 35 kPoise temperature $T^{35\ kP}$, wherein $T^{breakdown}$ is greater than $T^{35\ kP}$.

24. The alkali aluminosilicate glass of claim 20, wherein the alkali aluminosilicate glass is down-drawable.

25. The alkali aluminosilicate glass of claim 20, wherein the compressive stress is at least about 1000 MPa.

* * * * *

UNITED STATES PATENT AND TRADEMARK OFFICE
CERTIFICATE OF CORRECTION

| | |
|---|---|
| PATENT NO. | : 11,746,045 B2 |
| APPLICATION NO. | : 16/080797 |
| DATED | : September 5, 2023 |
| INVENTOR(S) | : Timothy Michael Gross et al. |

It is certified that error appears in the above-identified patent and that said Letters Patent is hereby corrected as shown below:

In the Claims

In Column 17, Line 57, in Claim 12, delete "pm" and insert -- µm --.

In Column 18, Line 29, in Claim 20, delete "$Li_2O$" and insert -- $Li_2O$; --.

Signed and Sealed this
Twenty-eighth Day of October, 2025

John A. Squires
*Director of the United States Patent and Trademark Office*